(12) United States Patent
Eldridge

(10) Patent No.: US 6,705,876 B2
(45) Date of Patent: *Mar. 16, 2004

(54) ELECTRICAL INTERCONNECT ASSEMBLIES AND METHODS

(75) Inventor: Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/114,586

(22) Filed: Jul. 13, 1998

(65) Prior Publication Data

US 2001/0012704 A1 Aug. 9, 2001

(51) Int. Cl.[7] .............................................. H01R 12/00
(52) U.S. Cl. ........................ 439/66; 324/754; 439/948
(58) Field of Search ........................... 439/66, 81, 948; 324/761, 754

(56) References Cited

U.S. PATENT DOCUMENTS

| | | | |
|---|---|---|---|
| 923,327 A | * | 6/1909 | Burton |
| 3,193,793 A | * | 7/1965 | Plunkett et al. |
| 3,290,636 A | * | 12/1966 | Overtveld |
| 3,794,953 A | * | 2/1974 | Malin |
| 3,842,189 A | * | 10/1974 | Southgate |
| 3,936,930 A | * | 2/1976 | Stern |
| 4,239,312 A | * | 12/1980 | Myer et al. |
| 4,352,061 A | * | 9/1982 | Matrone |
| 4,403,272 A | * | 9/1983 | Larson et al. |
| 4,428,633 A | * | 1/1984 | Lundergan |
| 4,553,192 A | * | 11/1985 | Babuka et al. |

(List continued on next page.)

FOREIGN PATENT DOCUMENTS

| | | |
|---|---|---|
| EP | 0 295 914 A2 | 12/1988 |
| FR | 2 680 284 A1 | 2/1993 |
| JP | 59-87842 * | 5/1984 |
| JP | 64-47090 * | 2/1989 |
| JP | 5-64784 | 8/1993 |
| JP | 7-94560 | 4/1995 |
| JP | 9-21828 | 1/1997 |
| JP | 9-45740 | 2/1997 |
| WO | WO 96/15459 A1 | 5/1996 |
| WO | WO 96/16440 A1 | 5/1996 |
| WO | WO 96/38858 A3 | 12/1996 |
| WO | WO 96/38858 A2 | 12/1996 |
| WO | WO 97/16866 A3 | 5/1997 |
| WO | WO 97/16866 A2 | 5/1997 |
| WO | WO 97/43654 A1 | 11/1997 |
| WO | WO 98/01906 | 1/1998 |

OTHER PUBLICATIONS

IBM Technical Disclosure, Clark, vol. 12, No. 11, p 1981, Apr. 1970.*

*Primary Examiner*—Neil Abrams
(74) *Attorney, Agent, or Firm*—N. Kenneth Burraston; Stuart L. Merkadeau

(57) ABSTRACT

Interconnect assemblies and methods for forming and using them. In one example of the invention, an interconnect assembly comprises a substrate, a resilient contact element and a stop structure with an embedded circuit element. The resilient contact element is disposed on the substrate and has at least a portion thereof which is capable of moving to a first position, which is defined by the stop structure, in which the resilient contact element is in mechanical and electrical contact with another contact element. In another example of the invention, a stop structure is disposed on a first substrate with a first contact element, and this stop structure defines a first position of a resilient contact element, disposed on a second substrate, in which the resilient contact element is in mechanical and electrical contact with the first contact element. Other aspects of the invention include methods of forming the stop structure and using the structure to perform testing of integrated circuits, including for example a semiconductor wafer of integrated circuits.

20 Claims, 20 Drawing Sheets

U.S. PATENT DOCUMENTS

| | | | | |
|---|---|---|---|---|
| 4,615,573 A | * | 10/1986 | White et al. | |
| 4,813,129 A | * | 3/1989 | Karnezos | 439/74 |
| 4,871,316 A | * | 10/1989 | Herrell et al. | |
| 5,172,050 A | | 12/1992 | Swapp | |
| 5,252,916 A | * | 10/1993 | Swart | 324/757 |
| 5,309,324 A | * | 5/1994 | Herandez et al. | 439/66 |
| 5,373,231 A | | 12/1994 | Boll et al. | |
| 5,476,211 A | | 12/1995 | Khandros | |
| 5,495,667 A | * | 3/1996 | Farnworth et al. | 174/260 |
| 5,498,902 A | * | 3/1996 | Hara | 257/686 |
| 5,555,422 A | | 9/1996 | Nakano | |
| 5,574,384 A | * | 11/1996 | Oi | 324/760 |
| 5,772,451 A | | 6/1998 | Dozier, II et al. | |
| 5,773,986 A | * | 6/1998 | Thompson et al. | 324/754 |
| 5,869,961 A | * | 2/1999 | Spinner | 324/158.1 |
| 5,917,707 A | | 6/1999 | Khandros et al. | |
| 5,974,662 A | | 11/1999 | Eldridge et al. | |
| 6,043,563 A | | 3/2000 | Eldridge et al. | |
| 6,049,976 A | | 4/2000 | Khandros | |
| 6,330,164 B1 | * | 12/2001 | Khandros et al. | 361/774 |
| 2002/0019152 A1 | | 2/2002 | Eldridge et al. | |

\* cited by examiner

ELECTRICAL INTERCONNECT ASSEMBLIES AND METHODS

FIELD OF THE INVENTION

The present invention relates to interconnect assemblies and methods for making and using interconnections and more particularly to interconnect assemblies for making electrical contact with contact elements on a semiconductor integrated circuit in either a temporary or permanent manner. More particularly, the present invention relates to techniques and assemblies for making interconnections to semiconductor devices to perform test and/or burn-in procedures on the semiconductor devices or to make permanent interconnections to the semiconductor devices.

BACKGROUND OF THE INVENTION

There are numerous interconnect assemblies and methods for making and using these assemblies in the prior art. For example, it is usually desirable to test the plurality of dies on a semiconductor wafer to determine which dies are good prior to packaging them and preferably prior to their being singulated from the wafer. To this end, a wafer tester or prober may be advantageously employed to make a plurality of discrete pressure connections to a like plurality of discrete contact elements (e.g. bonding pads) on the dies. In this manner, the semiconductor dies can be tested prior to singulating the dies from the wafer. The testing is designed to determine whether the dies are non-functional ("bad").

A conventional component of a wafer tester or prober is a probe card to which a plurality of probe elements are connected. The tips of the probe elements or contact elements effect the pressure connections to the respective bonding pads of the semiconductor dies. FIG. 1 shows an interconnect assembly 500 which is an example of a probe card in the prior art. The probe pins or contact elements 524 make connections to bonding pads 526 on the semiconductor wafer 508. The probe card assembly includes several components which are assembled together, including the probe card 502, the interposer 504, and the space transformer 506. The probe card 502 is typically a printed circuit board which includes circuit traces to various electrical components which are used in performing the electrical tests of the semiconductor die being probed. Contact elements 510 on the probe card 502 make contact with the bonding pads 526 through a series of intervening layers which include the interposer 504 and the space transformer 506 as shown in FIG. 1. The interposer 504 provides for a resilient, springlike positioning in the vertical or z direction in order to provide adequate contact for all contact elements at the bonding pads regardless of the length of the contact elements used on the intervening layers, such as the contact elements 524 which resemble springs. The space transformer 506 performs a pitch reduction and is also the substrate on which resilient contact elements are disposed. Further details concerning the probe card assembly 500 shown in FIG. 1 may be found in PCT International Publication No. WO 96/38858.

FIG. 2A shows in more detail an interposer assembly 300 having a substrate 302 on which resilient contact elements are attached, including contact elements 312, 314, 316, and 318. Contact elements 312 and 316 are electrically coupled from one side of interposer 300 to the other side by a through connect 304A, and contact elements 314 and 318 are electrically coupled by a through connect 306A. Examples of these resilient contact elements include any of a number of different spring type elements, including those described in the PCT International Publication No. WO 96/38858. When the interposer is used in an assembly such as the assembly 500 of FIG. 1, the resilient contact elements are flexed to a compressed state in which their vertical heights are reduced. This flexed state results in a force which drives the contact elements into their corresponding connection points, such as the bonding pads 526. FIGS. 2B and 2C show an alternative interposer structure of the prior art. The interposer 300A includes a substrate 302A. Two resilient contact elements 312A and 314A are attached to one surface of the substrate 302A. The resilient contact elements of the bottom portion of the substrate 302A are not shown in this figure. The resilient contact elements on the upper surface of the substrate 302A are protected by a channel structure 302B which surrounds the resilient contact elements 312A and 314A. This can be seen from the top view of the interposer 300 which is shown in FIG. 2C. The channel 302B protects the resilient contact elements within the channel but is not designed to contact another substrate, and the channel 302C protects resilient contact elements 314B but is not designed to contact another substrate.

FIG. 3A shows another example of an interposer of the prior art. The substrate 334 is placed over the interconnection elements 332 so that the interconnection elements 332 extend through the holes 336. The interconnection elements 322 are loosely held within the substrate by a suitable material 338, such as an elastomer which fills the holes 336 and which extends from the top and the bottom surfaces of the support substrate. FIG. 3B illustrates another interposer structure of the prior art in which the interconnection element within the hole 336 is attached to (e.g. by soldering) the middle portions of the holes 366 in the substrate 364.

FIG. 4 illustrates another interconnect assembly of the prior art. This interconnect assembly is sometimes referred to as a cinch connector 400. As shown in FIG. 4, two contact elements 406 and 407 are disposed on a substrate 401 in order to make contact with two other contact elements 408 and 409 which are disposed on another substrate 402. The intermediate layer 403 includes holes 404 and 405. The hole 404 is positioned between the contact elements 407 and 408, and the hole 405 is positioned between the contact elements 407 and 409. Each hole includes a resilient material which is used to make contact between its respective contact elements as shown in FIG. 4. When the substrates 401 and 402 are pressed together, the contact elements or pads 406 and 408 move toward each other as do the contact elements 407 and 409. The movement is stopped when each element comes into mechanical contact with the intermediate layer 403, and electrical contact is established by the respective conductive spring which is disposed between the two contact elements.

As can be seen from the foregoing discussion, the use of resilient contact elements to make contacts to bonding pads or to other contact elements allows for tolerance in the vertical or z direction such that most if not all contact elements will be able to make contact even if their lengths vary slightly. However, this tolerance sometimes leads to the destruction of resilient contact elements as they are compressed too much in the vertical direction. While the assemblies shown in FIGS. 2B and 2C and in FIG. 3A may tend to protect resilient contact elements, they do not and are not intended to define a position in which all contact elements should have made contact vertically. The cinch connector of FIG. 4 does tend to protect the resilient contact elements by preventing the substrates 401 and 402 from coming too close together. However, this assembly is relatively complicated due to the requirement of having, in a separate layer, a plurality of holes each of which includes and supports a spring.

Thus it is desirable to provide an improved interconnect assembly which may take advantage of the features of a resilient contact element without having too much tolerance in the z direction which could result in the overflexing or destruction of the resilient contact elements. This is particularly important for interconnection over large mating areas (as in semiconductor wafers), where tolerance issues make controlled deflection of interconnect elements difficult.

SUMMARY OF THE INVENTION

The present invention provides a plurality of interconnect assemblies and methods for making and using these assemblies. In one example of the present invention, an interconnect assembly includes a substrate and a resilient contact element having at least a portion thereof which is capable of moving to a first position. The resilient contact element is disposed on the substrate. A stop structure, also disposed on the substrate, defines the first position in which the resilient contact element is in mechanical and electrical contact with another contact element.

Typically in this example, the another contact element is disposed on another substrate, and the stop structure defines a minimum separation between the substrate and the another substrate when the resilient contact element is in mechanical and electrical contact with the another contact element.

According to another example of the present invention, an interconnect assembly includes a first substrate and a first contact element which is disposed on the first substrate. A stop structure defines a first position of a first resilient contact element which is disposed on a second substrate when the resilient contact element is in mechanical and electrical contact with the first contact element. Typically, the resilient contact element has at least a portion thereof which is capable of moving to a first position when the resilient contact element is compressed.

The present invention also includes various methods, including a method for forming an interconnect assembly. In this method, a resilient contact element is formed on a substrate. The resilient contact element has at least a portion thereof which is capable of moving to a first position. A stop structure is also formed on the substrate, and it defines the first position when the resilient contact element is in mechanical and electrical contact with another contact element.

According to another example of a method of the present invention, a first contact element is formed on a first substrate and a stop structure is also formed on the first substrate. The stop structure defines a first position of a resilient contact element when the resilient contact element is in mechanical and electrical contact with the first contact element.

Various other assemblies and methods are described below in conjunction with the following figures.

BRIEF DESCRIPTION OF THE DRAWINGS

The present invention is illustrated by way of example and not limitation in the figures of the accompanying drawings in which like references indicate similar elements.

DETAILED DESCRIPTION

The present invention relates to interconnection assemblies and methods and particularly to interconnect assemblies for making mechanical and electrical connection to contact elements on an integrated circuit. The following description and drawings are illustrative of the invention and are not to be construed as limiting the invention. Numerous specific details are described to provide a thorough understanding of the present invention. However, in certain instances, well known or conventional details are not described in order to not unnecessarily obscure the present invention in detail.

Figure 1:
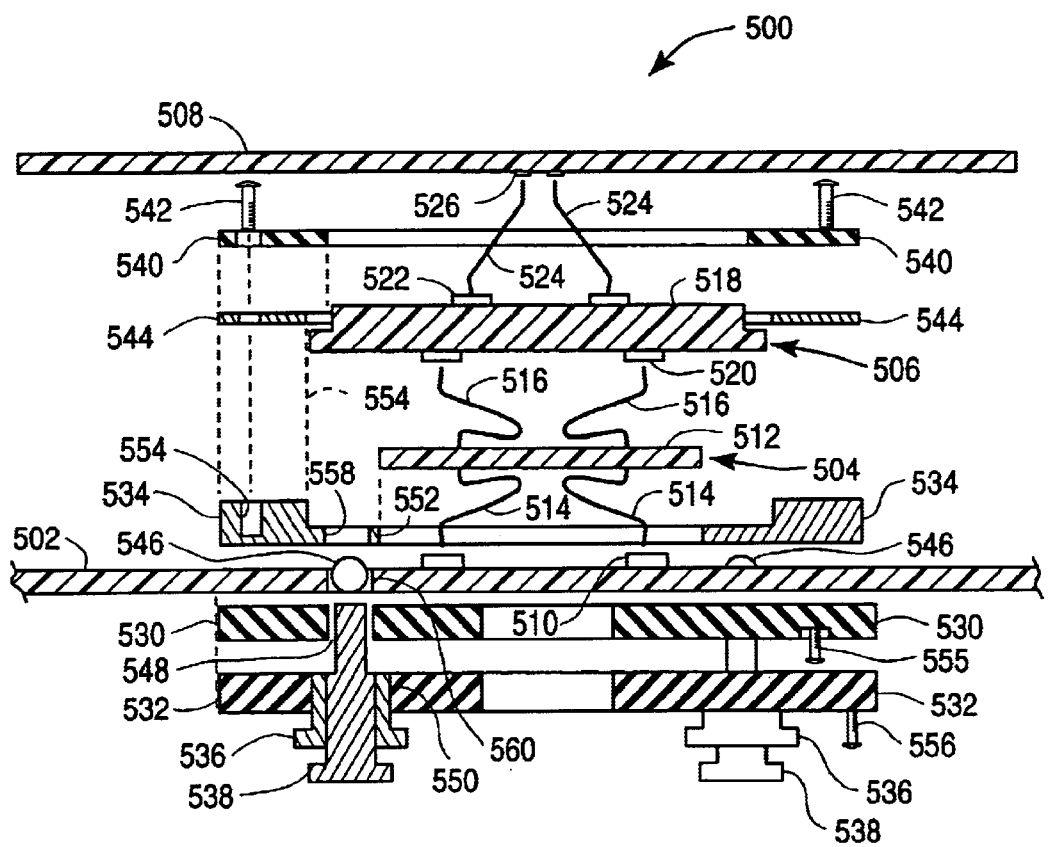
FIG. 1 shows an example of a probe card assembly in the prior art.
Figure 2A:
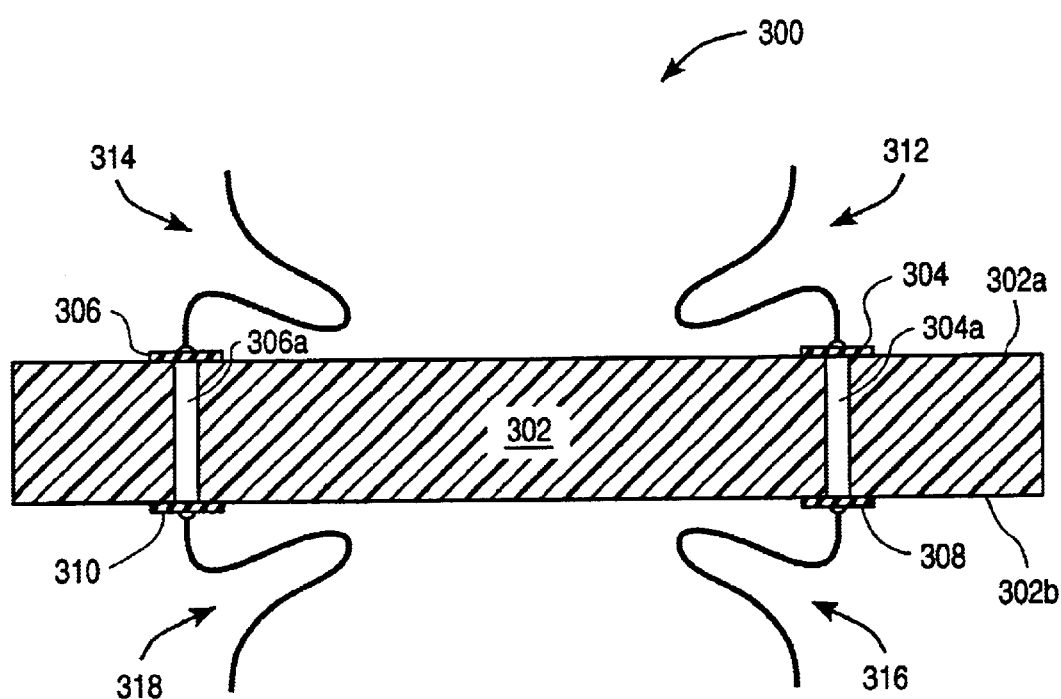
FIG. 2A shows an example of an interposer which is an element of a probe card assembly of the prior art.
Figure 2B:
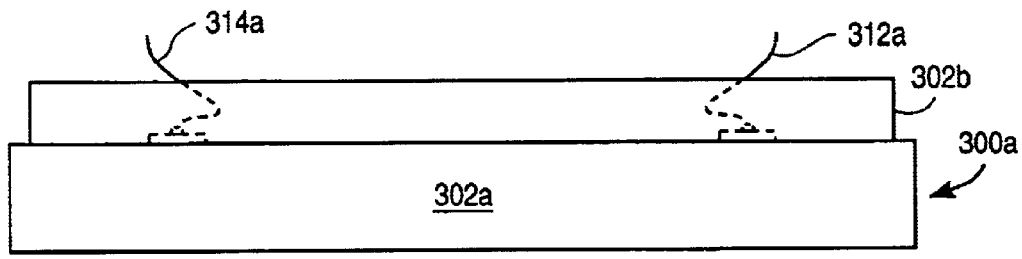
FIG. 2B shows an cross-sectional view of another example of an interposer which may be used in probe card assemblies of the prior art.
Figure 2C:
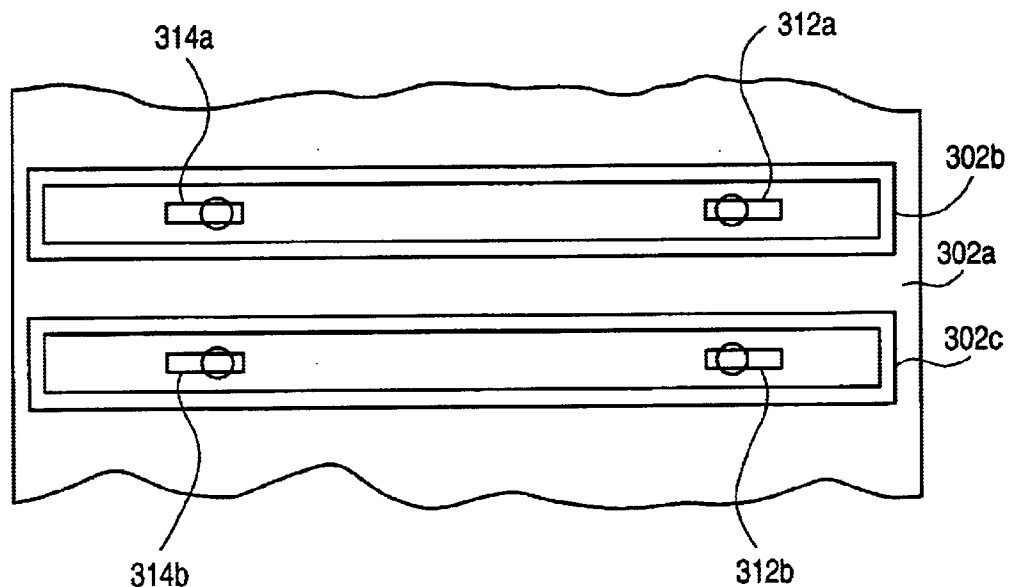
FIG. 2C shows a top view of the interposer shown in FIG. 2B.
Figure 3A:
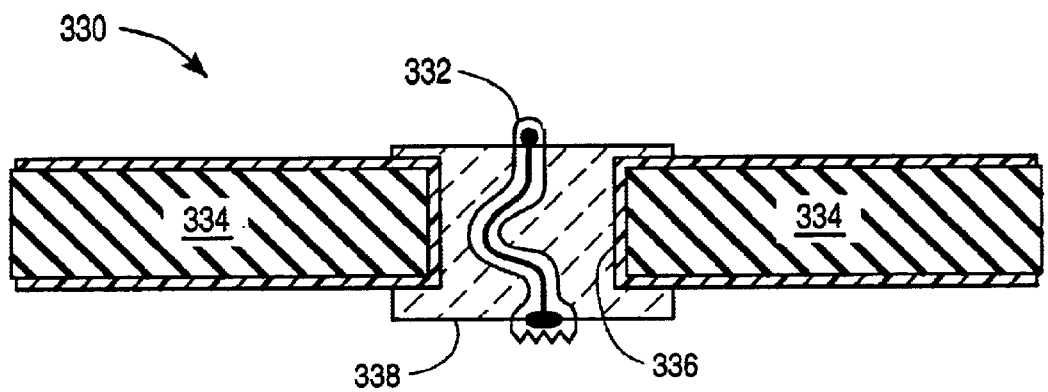
FIG. 3A shows a cross-sectional view of another example of an interposer of the prior art.
Figure 3B:
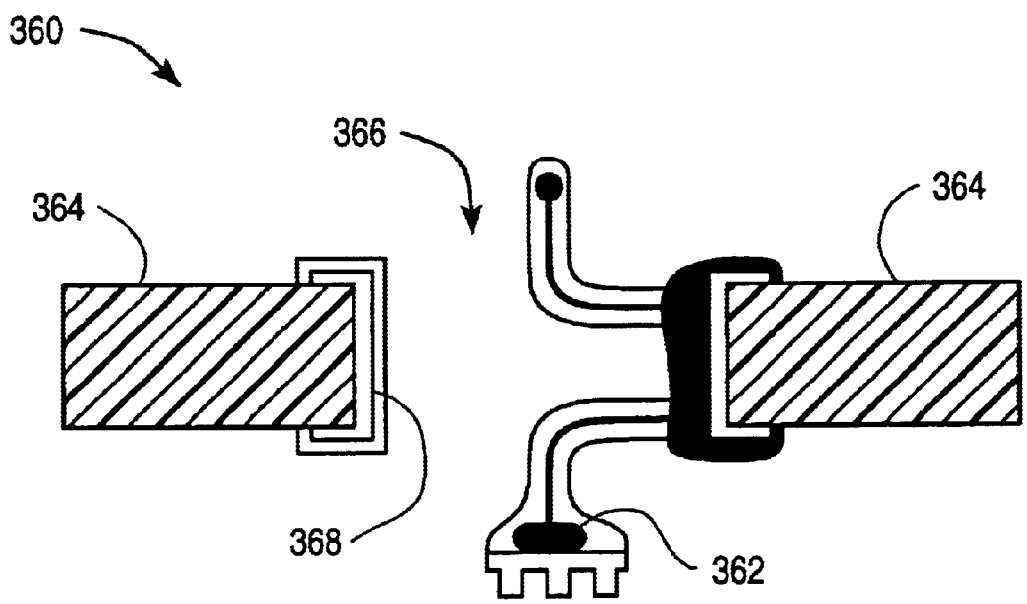
FIG. 3B shows a cross-sectional view of another interposer structure of the prior art.
Figure 4:
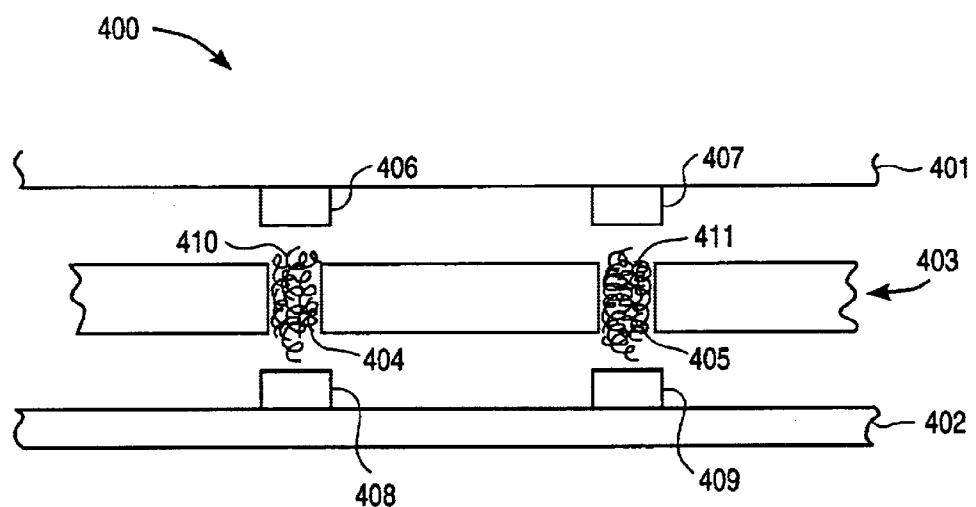
FIG. 4 shows an example of an interconnect assembly of the prior art.
Figure 5A:
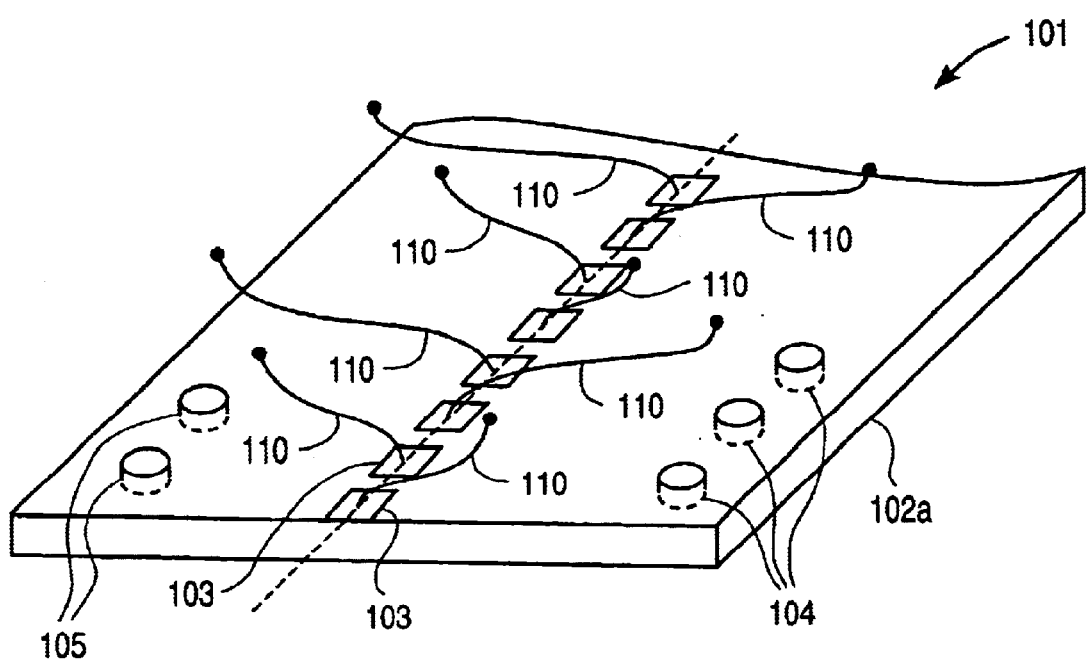
FIG. 5A shows a perspective view according to the invention in which resilient contact elements are disposed on a substrate along with stop structures on the substrate.

FIG. 5A shows a perspective view of eight resilient contact elements 110, each of which are disposed on a substrate 102A. The interconnect assembly shown in FIG. 5A may be formed by any number of methods; for example, the resilient contact elements may be mechanically secured to pads 103 by a wire bonding operation. Alternatively, the resilient contact elements may be lithographically formed. Also disposed on the substrate 102A are a plurality of stop structures. The left row of stop structures 105 protrudes above the top surface of the substrate 102A by a predetermined amount which will typically be the same amount by which the right row of stop structures 104 protrudes above this top surface. These stop structures are designed to determine/limit the maximum amount of compression or flexing which can occur with the resilient contact elements. Each resilient contact element includes at least a portion thereof which is capable of moving to a first position when the resilient contact element is compressed in a vertical direction towards the top surface of the substrate 102A. Each stop structure is sized vertically such that it defines a first position when the resilient contact elements are in mechanical and electrical contact with other contact elements. Each stop structure is designed, in one embodiment, so that its vertical height above the substrate is less than the vertical height of the shortest resilient contact element which statistically is reasonably likely to exist (e.g. the stop's height is less than 99.9% of the heights of possible resilient contact elements).

Figure 5B:
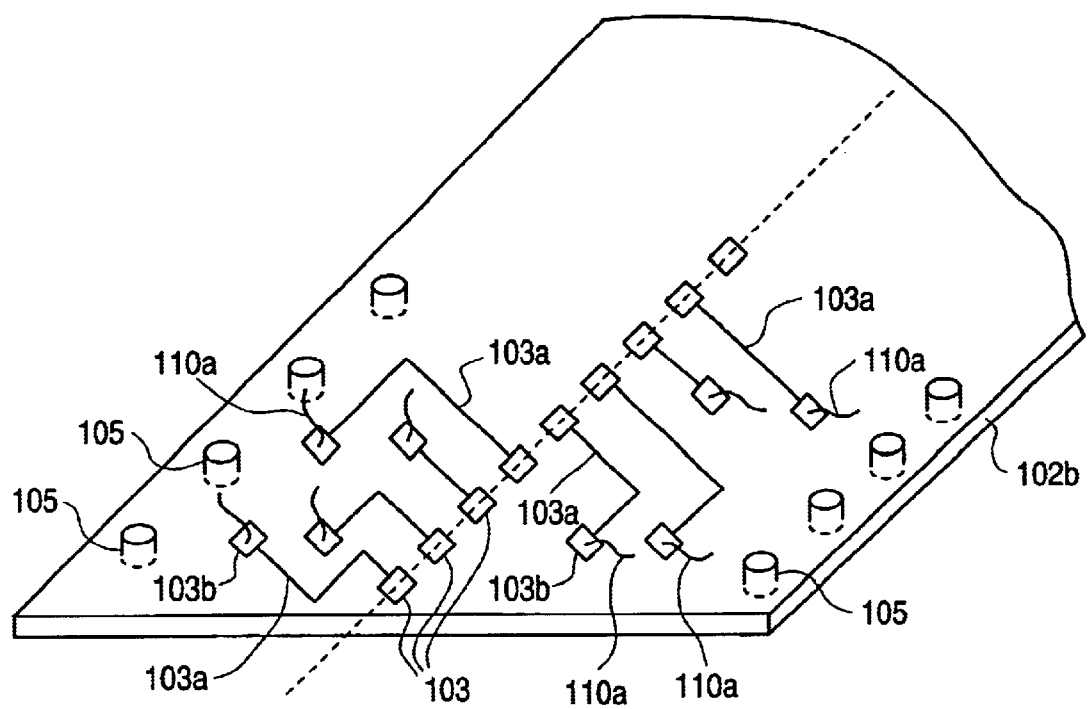
FIG. 5B shows a perspective view of an embodiment of the invention in which resilient contact elements are disposed with a fan-out on a substrate with stop structures.

FIG. 5B shows a perspective view of another embodiment of the invention in which an in-line row of bonding pads 103 are coupled by fan-out traces 103A to several resilient contact elements 110A. The fan-out traces 103A allow a spatial distribution of the resilient contact elements from the in-line row without requiring the use of resilient contact elements having different lengths (as in the case of FIG. 5A where the resilient contact elements 110 have different lengths in order to make contact to spatial dispersed elements). Each of the bonding pads 103 is coupled electrically to a corresponding fan-out trace 103A which is electrically coupled to a corresponding pad 103B, and each resilient contact element 110A is electrically and mechanically coupled to a corresponding pad 103B. Several stop structures 105 are disposed on the surface of the integrated circuit 102B.

Figure 6A:
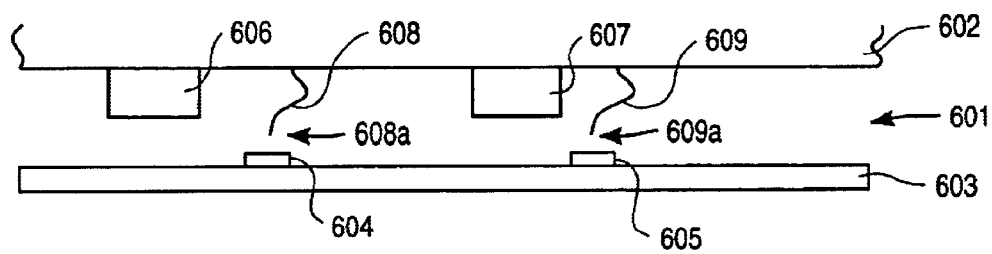
FIG. 6A shows an example of one embodiment of the present invention (before mechanical and electrical contact is made).
Figure 6B:
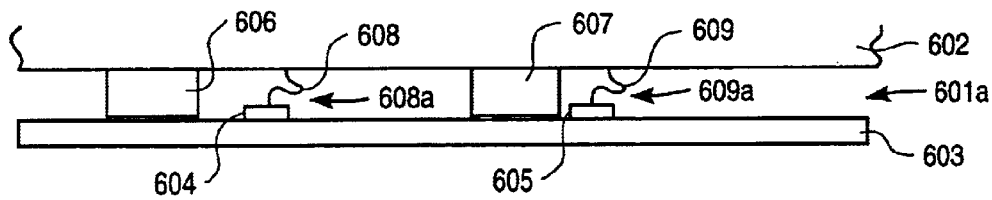
FIG. 6B shows the interconnect assembly of FIG. 6A when mechanical and electrical contact has been made.

FIG. 6A shows an example of an interconnect assembly 601 of the present invention. The interconnect assembly 601 includes a substrate 602 and a substrate 603. The substrate 603 includes two contact elements 604 and 605 which are attached to the substrate 603 and thereby disposed on the substrate 603. The substrate 602 includes two stop structures 606 and 607 which may be disposed in relative proximity to the resilient contact elements 608 and 609. These resilient contact elements may be the spring interconnect elements described in the PCT International Publication No. WO 96/38858. Each resilient contact element includes a tip or farthest extent which typically extends beyond the top of the respective stop structure as shown in FIG. 6A. For example, the tip 608A of the resilient contact element 608 extends beyond the top of the stop structure 606 such that the total vertical length of the resilient contact member 608 exceeds the total vertical length of the stop structure 606. The height of the stop structure is predetermined in order to define a first position when the resilient contact element is in mechanical and electrical contact with another contact element. Further, the stop structure's height defines a separation between one substrate 602 and the other substrate 603 when the resilient contact element is in mechanical and electrical contact with another contact element, such as the contact elements 604 and 605. This is further shown in FIG. 6B in which the substrates 602 and 603 have been forced together to create the interconnect assembly 601A. As can be seen from FIG. 6B, the stop structures 606 and 607 are in mechanical contact with the substrate 603; in particular, the top surface of each stop structure is mechanically abutting the top surface of the substrate 603. This defines the first position of the tip 608A and the tip 609A of the resilient contact elements 608 and 609 respectively as they make contact with the contact elements 604 and 605 respectively.

It will be appreciated that the interconnect assembly 601 may be used in a number of different contexts. For example, the substrate 602 may be part of a probe card assembly which is coupled to a wafer prober or wafer tester and the substrate 603 may be a semiconductor integrated circuit or a plurality of integrated circuits on a semiconductor wafer. Alternatively, substrate 602 may be part of a semiconductor integrated circuit or a plurality of integrated circuits on a semiconductor wafer. In this case, the resilient contact elements will typically be coupled to bonding pads or other contact elements on the integrated circuit, and the stop structures will be attached to the top surface of the integrated circuit. The substrate 603 may be part of a probe card structure which is designed to make electrical contact with the various resilient contact elements in order to test or burn-in the integrated circuit or a plurality of integrated circuits on a semiconductor wafer. Alternatively, the substrate 603 may be part of a package assembly which is used to make permanent contact through the resilient contact elements, such as the elements 608 and 609 shown in FIG. 6A.

Figure 6C:
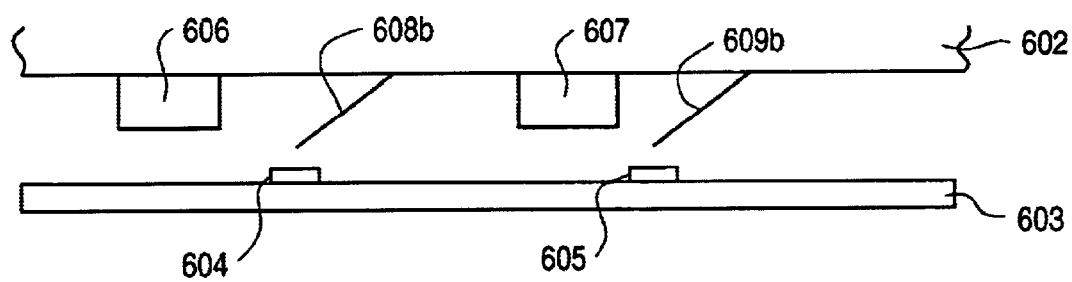
FIG. 6C shows an example of another embodiment of the present invention (before mechanical and electrical contact is made).
Figure 6D:
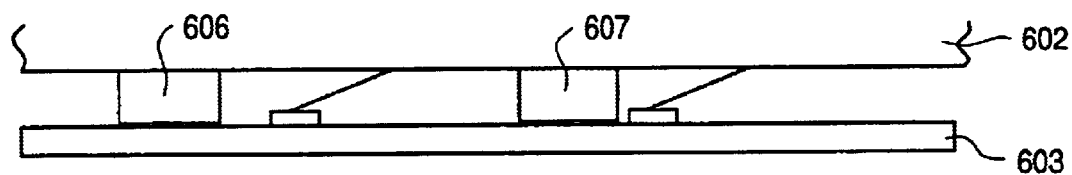
FIG. 6D shows the interconnect assembly of FIG. 6C when electrical and mechanical contact has been made.

FIGS. 6C and 6D show another example of the present invention which uses straight (cantilever-style) resilient contact elements 608B and 609B. These straight resilient contact elements are secured to the substrate 602 and bend to a compressed state as shown in FIG. 6D when the substrate 602 is pressed towards the substrate 603. The stop structures 606 and 607 determine the separation between the two substrates and determine the amount of compression of each resilient contact element when it is brought into mechanical and electrical contact with its corresponding pad.

Figure 7:
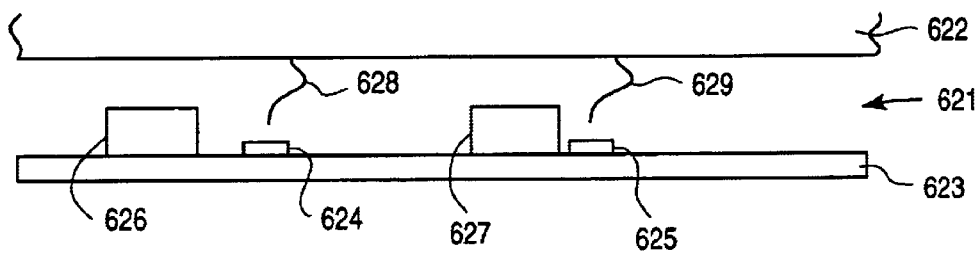
FIG. 7 shows another example of an interconnect assembly according to the present invention.

FIG. 7 shows an example of another interconnect assembly according to the present invention. The interconnect assembly 621 of FIG. 7 includes a substrate 622 and a substrate 623. Two resilient contact elements 628 and 629 are attached to a surface of the substrate 622 in order to make contact with the contact elements 624 and 625 respectively of the substrate 623. Two stop structures 626 and 627 are also attached to the substrate 623 and are positioned relatively proximately adjacent to the corresponding contact elements 624 and 625. When the substrate 622 and 623 are forced together, the resilient contact elements 628 and 629 will flex to a position determined by the height of the stop structures. In one particular embodiment, the height of the stop structure may be from approximately 5 to 40 mils and the height of a resilient contact element before being compressed may be approximately 45 mils. The particular height of the stop structure relative to the height of the resilient contact element before compression will depend in part on the ability to control the planarity of the tips of the various resilient contact elements before compression. If this planarity can be controlled to great precision, then the height of the stop structure may be only slightly less than the height of a resilient contact element before compression. On the other hand, smaller stop structures provide a larger tolerance for error in forming an array of resilient contact elements to a particular height. The height of a stop structure is typically less than 150 mils and preferably less than 40 mils.

It will be appreciated that the present invention may be used with a large or small number of resilient contact elements and a number of stop structures disposed on the same or a different substrate. The invention may be used with a single (singulated) IC with a stop structure and a resilient contact element or with IC's on a semiconductor wafer where each such IC includes at least one stop structure and a resilient contact element. Each resilient contact element may have a corresponding stop structure (e.g. a post-like stop structure as in FIG. 5B) or one stop structure may be shared by several resilient contact elements (as shown in FIG. 9D). Furthermore, it will be appreciated that the contact elements and the resilient contact elements are coupled to various circuit elements, whether these circuit elements are disposed on the integrated circuit being tested or in a probe card circuit or in a circuit used in a finally assembled system which includes the packaged integrated circuit.

Figure 8A:
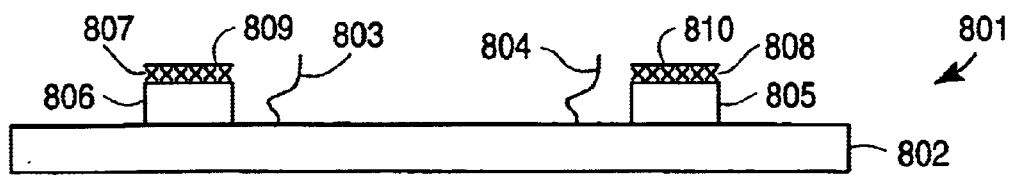
FIG. 8A shows an example of another embodiment of an interconnect assembly according to the present invention.

FIG. 8A illustrates another example of an interconnect assembly according to the present invention. The interconnect assembly 801 includes a substrate 802 which is attached to two stop structures 805 and 806. Also attached to the substrate 802 are two resilient contact elements 803 and 804. It will be appreciated that the substrate 802 may be part of an integrated circuit or may be part of a probe card assembly or other testing or burn-in apparatus. Each stop structure as shown in FIG. 8A includes an adhesive layer and a covering disposed over the adhesive layer. Stop structure 806 includes an adhesive layer 807 disposed on the top surface of the stop structure, and a covering 809 is disposed over the adhesive 807. This covering may be layer such as a foil or a plastic which may be peeled away or otherwise removed from the adhesive. Similarly, the stop structure 805 includes an adhesive layer 808 and a covering layer 810. The coverings may be peeled away in order to expose the adhesive and then the adhesive may be used to attach the stop structure as well as the rest of the assembly 801 onto another object, such as another substrate. For example, the substrate 802 may be attached to an integrated circuit (not shown) such that the bonding pads of the integrated circuit mate with the resilient contact elements in order to make mechanical and electrical contact with those elements. The substrate 802 may adhere to the top surface of the integrated circuit by removing the coverings on the top of the stop structures and by pressing the substrate 802 down towards the integrated circuit such that the adhesive on the stop structures is brought into contact with the top surface of the integrated circuit. Thus, the adhesive layers on the tops of the stop structures bond substrate 802 to the integrated circuit and cause the resilient contact elements to be secured into mechanical and electrical contact with the corresponding bonding pads or other contact elements on the integrated circuit. In this manner, a package for the integrated circuit may be formed between the substrate 802 and its corresponding structures and the integrated circuit. It will be appreciated that in this example, the substrate 802 will include interconnections from the various resilient contact elements towards other contact points to allow interconnection to other electrical components outside of the packaged assembly formed by the substrate 802 and the integrated circuit which is attached to the substrate.

Another use of the interconnect assembly 801 of FIG. 8A may involve the case where the substrate 802 is itself an integrated circuit, and the resilient contact elements 803 and 804, as well as other contact elements necessary to make connections, are attached to the various bonding pads or other contact elements on the integrated circuit. The stop structures may be attached to the top surface of the integrated circuit as shown in FIG. 8A. After the coverings above the adhesive layers are removed, the integrated circuit may be pressed against another wiring substrate in order to make electrical contact between the circuitry in the integrated circuit in the substrate 802 in this example and various outside electrical components through the another substrate. This another substrate may be part of a probe card assembly or a burn-in assembly or may be part of a final integrated circuit package which includes interconnections to the "outside" environment.

Figure 8B:
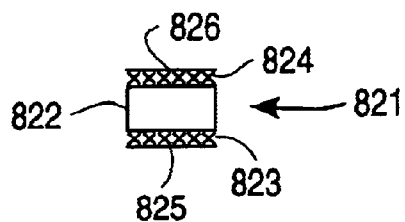
FIG. 8B shows another example of a stop structure according to the present invention.

FIG. 8B shows an alternative embodiment of a stop structure 821 in which adhesive layers are applied to the top and bottom layers of the stop structure 822. The adhesive layer 824 is formed on the top surface of the stop structure 822, and a covering 826 which is removable is placed on this adhesive. Another adhesive layer 823 is formed on the bottom surface of the stop structure 822 and is covered by the covering 825. This stop structure may be formed in a sheet or film and applied to a substrate in order to form a plurality of stop structures on a substrate. This will be further described in conjunction with FIGS. 9A, 9B, and 9C.

Figure 9A:
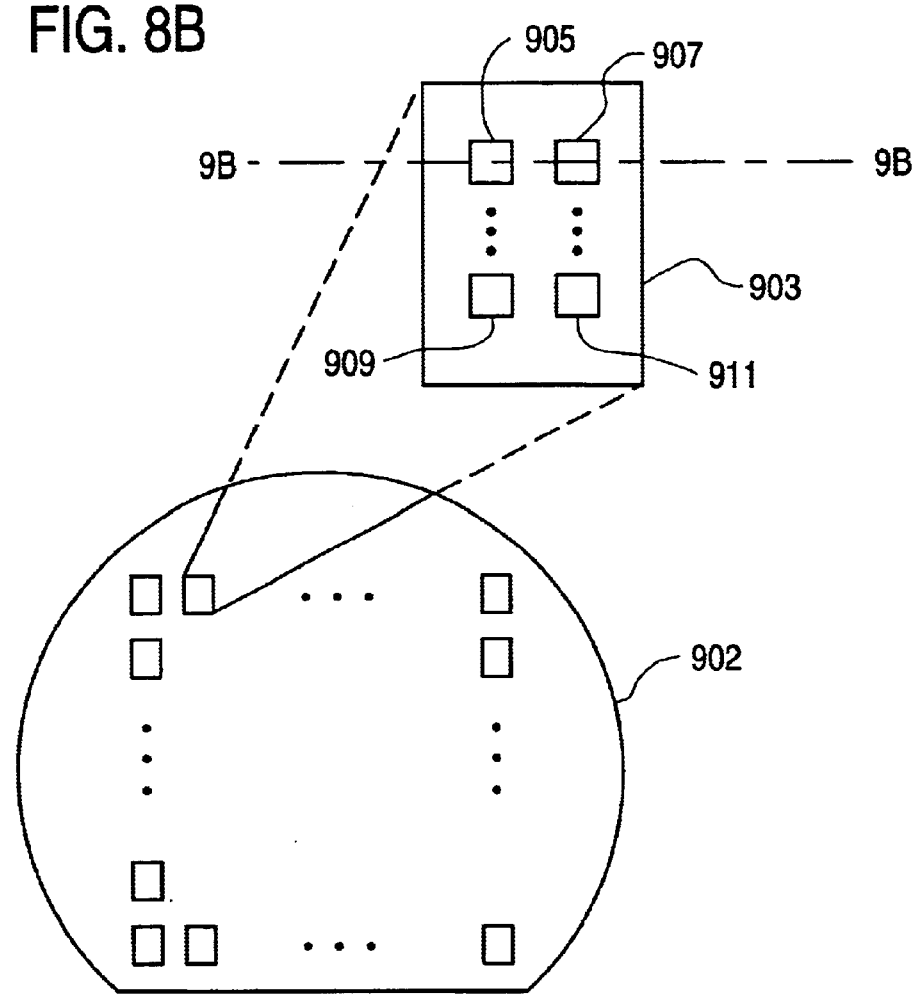
FIG. 9A illustrates a layer for a die (an integrated circuit) which layer may be used to make stop structures according to the present invention.
Figure 9B:
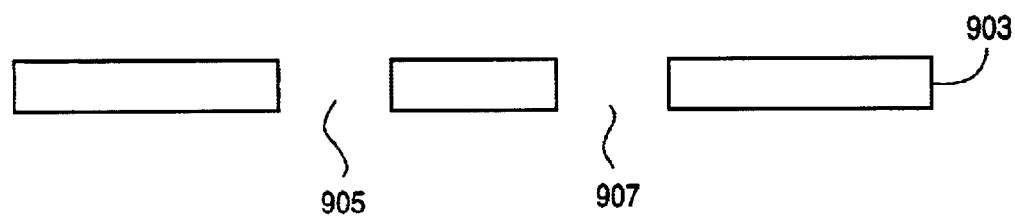
FIG. 9B illustrates a cross-sectional view through the line 9b—9b of the layer of FIG. 9A.
Figure 9C:
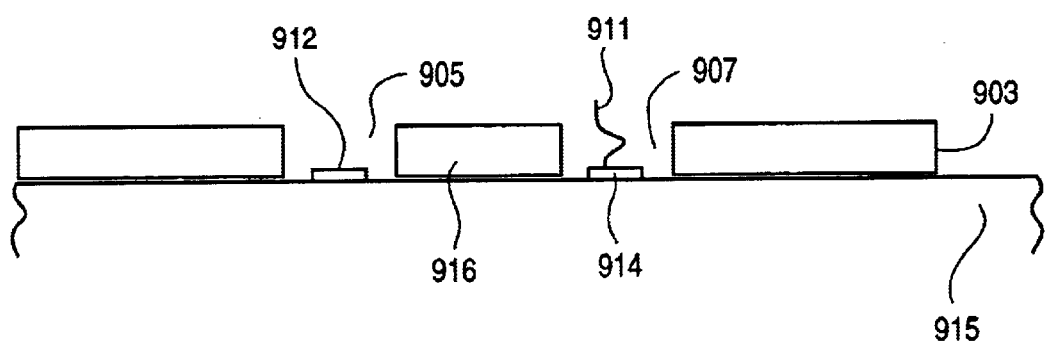
FIG. 9C shows the use of the layer of FIGS. 9A and 9B on a substrate in accordance with one embodiment of the present invention.
Figure 9D:
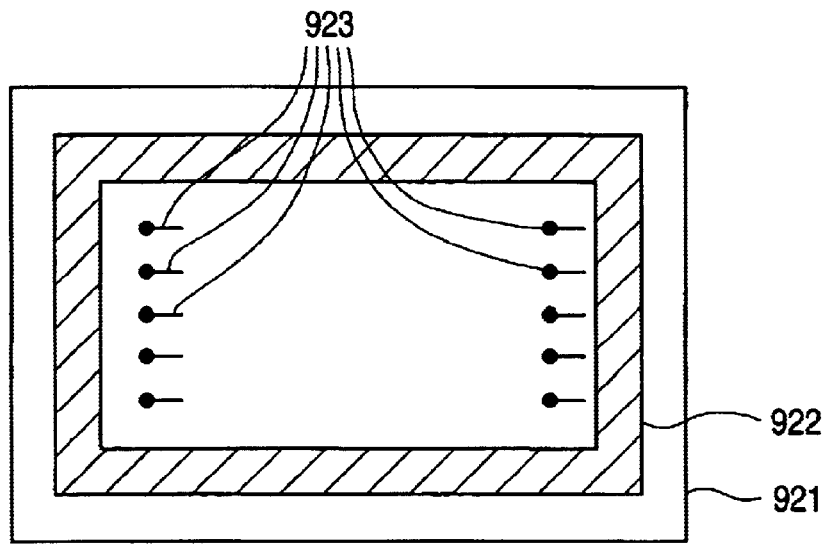
FIG. 9D shows another example of a stop structure for an integrated circuit according to the present invention.

A layer 903 shown in FIG. 9A has two rows of openings in a sheet or film; these openings are designed to surround at least one resilient contact element as shown in FIG. 9C. FIG. 9A shows four openings 905, 907, 909, and 911 formed in the sheet or film. The layer 903 is, in the embodiment shown in FIG. 9A, part of a sheet which is designed to fit on a semiconductor wafer 902 of integrated circuits. The layer 903 may be formed from any of a number of possible materials, including for example, a polyimide material. The openings may be etched or punched or cut into the layer 903. These openings are formed in the layer in order to create openings for contact elements on the integrated circuits of the semiconductor wafer (or for contact elements on another type of substrate). It will be appreciated that in an alternative embodiment, the layer 903 may be designed to be applied to and to cover only a single integrated circuit and hence will not be applied to cover multiple IC's on a wafer. The line 9b—9b shown in FIG. 9A shows a cross-sectional view of the layer 903, which cross-sectional view is shown in FIG. 9B.

The layer 903 is applied to a substrate 915 as shown in FIG. 9C. The openings 905 and 907 are for contact elements, such as contact elements 912 and 911. FIG. 9C shows a hybrid structure in which some contact elements, such as contact element 912, do not include a resilient contact element and other contact elements, such as contact element 911, include a resilient contact element. It will be appreciated that typically, such hybrid structures are not preferred, although they are still within the scope of the present invention. The substrate 915 may be a semiconductor wafer which includes a plurality of integrated circuits or may be a single integrated circuit or may be a contact or interconnect structure of a probe card assembly or a burn-in test assembly. The layer 903 may be applied to the substrate 915 by using an adhesive between the abutting faces of the layer 903 and the substrate 915. In this case, the layer 903 may be a sheet of material which is formed and then applied to the substrate 915 with an adhesive between the two abutting surfaces. Alternatively, the layer 903 may be formed photolithographically on the substrate 915; in this case, the layer 903 may be formed from a negative photoresist which is patterned and cured to hardness to form the stop structure. The layer 903 may also include an adhesive on its top surface in the same way that the stop structures of FIGS. 8A and 8B include such adhesives. It will be appreciated that the layer 903 as formed on the substrate 915 provides stop structures in accordance with the present invention, such as the stop structure 916 which surrounds the contact element 912.

It will also be understood that the layer 903 may be used to hermetically seal the IC which is covered by the layer 903 such that the IC is protected from environmental conditions (i.e. humidity). For example, if the bottom of layer 903 is adhesively secured to the IC or is photolithographically formed on the IC, the top of the layer 903 may be adhesively attached (or otherwise secured) to a substrate, such as a cover, which forms a hermetic seal for the IC.

FIG. 9D is a plan view which shows another example of a stop structure which surrounds several resilient contact elements. In particular, FIG. 9D illustrates an IC 921 having a perimeter stop structure 922 which surrounds several resilient contact elements 923. This perimeter stop structure 922 may be formed from a sheet which is secured to the top surface of IC 921 or it may be formed in place (e.g. photolithographically) on the IC 921. The top surface of the stop structure 922 may be coated with an adhesive which is used to secure the stop structure 922 to a cover or other package.

Figure 9E:
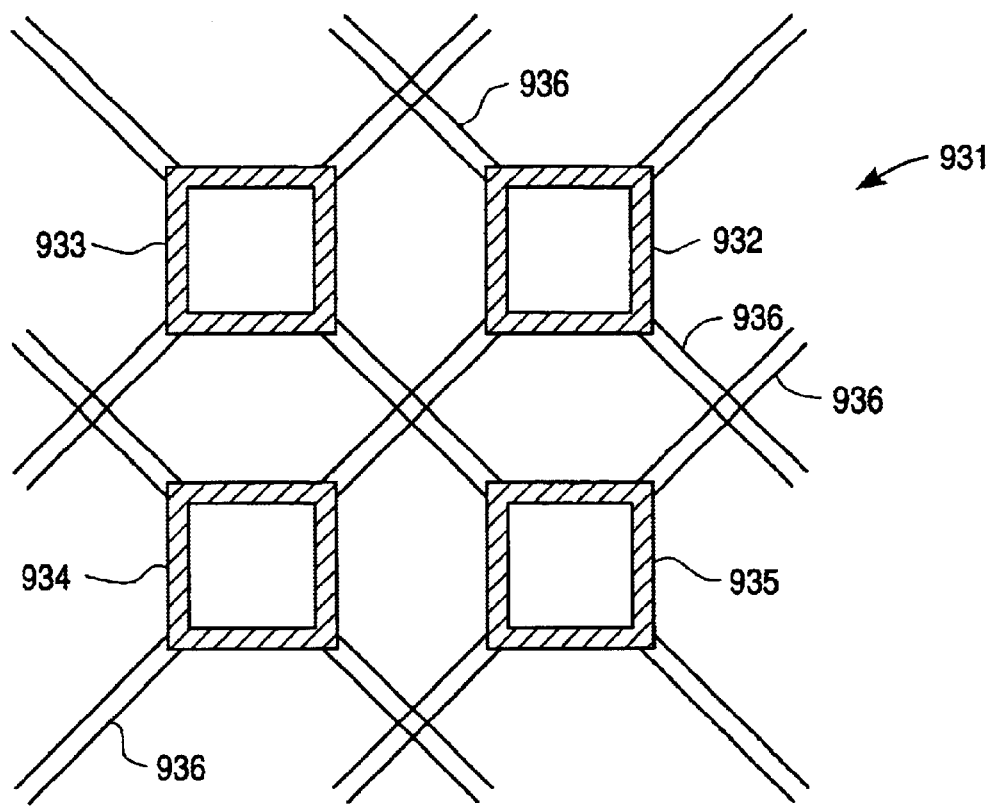
FIG. 9E illustrates an example of a sheet of material for forming several stop structures at the same time, each stop structure being similar to the stop structure of FIG. 9D.

FIG. 9E shows an example of a sheet 931 containing several perimeter stop structures 932, 933, 934 and 935 which are held together by a web 936 of interconnecting material. The sheet may be formed from a polyimide material or from epoxy material or other materials. The sheet 931 may be applied over a wafer of ICs to simultaneously place a perimeter stop structure on each of several ICs on the wafer. The sheet 931 may be secured to the wafer by an adhesive. It will be understood that the sheet 931 may contain a stop structure for each IC on a wafer. After the sheet 931 is applied to the wafer, the web 936 is typically cut in the normal singulation process in which each IC is cut from the wafer. After singulation, each IC will include a perimeter stop structure as shown in FIG. 9D.

Figure 9F:
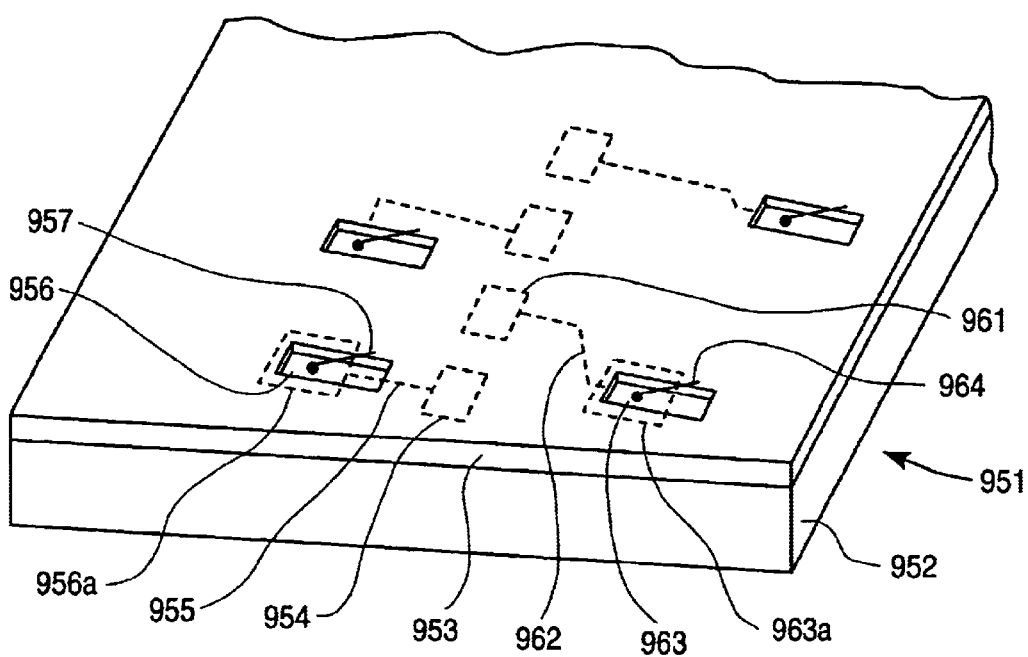
FIG. 9F is a perspective view of stop structures with openings for contact elements which are fanned out from bonding pads.

FIG. 9F shows by perspective view another example of the present invention. In this example, a sheet 953 is applied to the top surface of a substrate 952 which may be an IC (or may be a space transformer or other structure). The sheet 953 includes openings, such as openings 956 and 963, which may be cut or otherwise formed in the sheet 953. The openings are aligned with fan-out pads; for example, the opening 956 in sheet 953 is aligned over at least a portion of fan-out pad 956A to provide the opening over at least a portion of fan-out pad 956A. Similarly, the opening 963 is aligned over at least a portion of fan-out pad 963A to provide an opening over this fan-out pad. A resilient contact element, such as element 957 or 964, is mechanically and electrically coupled to its corresponding fan-out pad which is electrically coupled to a fan-out trace, such as trace 955 or trace 962. Each fan-out trace electrically couples its corresponding pad, such as pad 954 or pad 961, to the corresponding fan-out pad. Hence, the resilient contact elements provide dispersed, remote electrical contacts for the in-line row of pads such as pads 954 and 961. Each opening around a resilient contact element provides a stop structure which surrounds the resilient contact element. It will be appreciated that, in an alternative embodiment of FIG. 9F, the sheet 953 may be replaced by a layer which is formed in place on the top surface of the substrate 952 (e.g. a patterned layer formed from a photoresist or insulating material (such as silicon dioxide)).

Figure 10A:
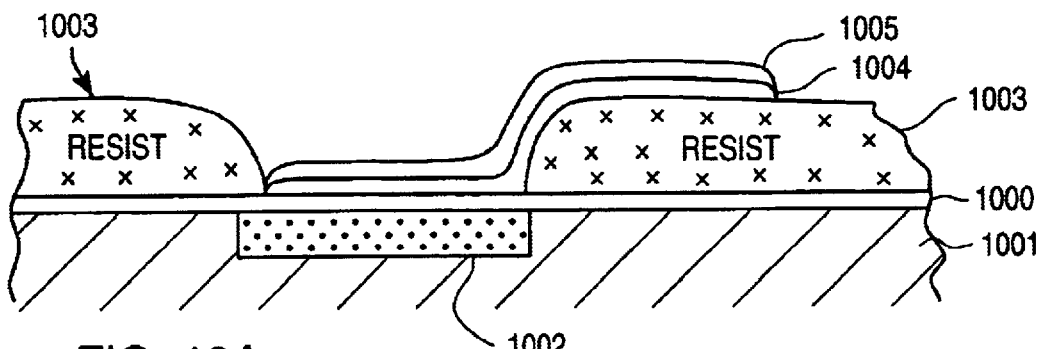
FIGS. 10A, 10B, and 10C illustrate one method for lithographically forming a contact element and a corresponding stop structure according to one example of the present invention.
Figure 10B:
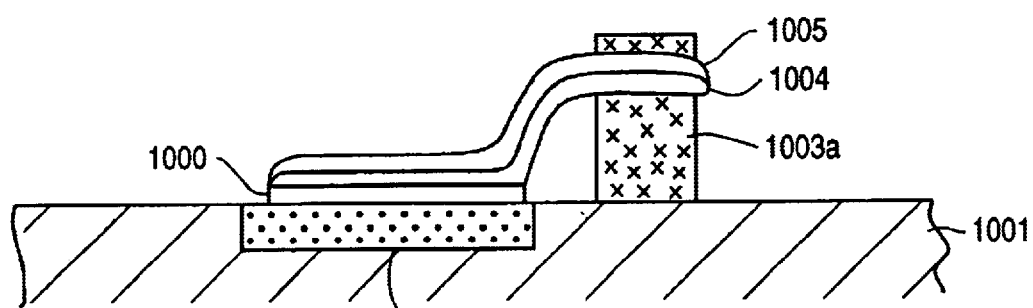
Figure 10C:
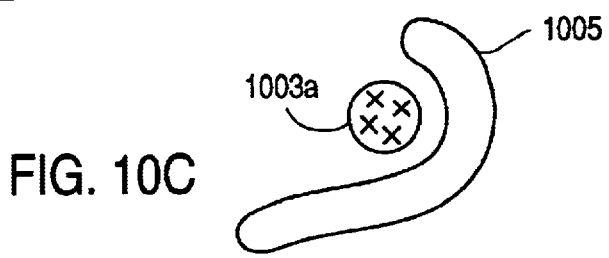

FIGS. 10A, 10B, and 10C illustrate a method for lithographically creating both a resilient contact element and a corresponding stop structure. The process shown in FIG. 10A assumes that a substrate 1001 is a semiconductor wafer which includes a contact element 1002 (e.g. a bonding pad) disposed thereon, although the process may be used on other substrates having contact elements. FIGS. 10A and 10B show cross-sectional views taken through the contact element 1002, and it will be appreciated that this contact element makes electrical contact with other circuit elements not shown in the integrated circuit which is formed in the substrate 1001. A plating layer or surface 1000 is applied to the top surface of the substrate 1001; this plating surface 1000 may be applied by sputtering a conductive metal onto the substrate 1001. This plating surface 1000 will be used as an electrode in a subsequent electroplating process. A resist layer 1003 is formed and patterned on the plating surface 1000 such that an opening in the resist layer exists over the contact element 1002. A first metal layer 1004 is then deposited and patterned over the contact element 1002 (and the plating surface 1000) in the opening of the resist 1003 and also over a portion of the resist 1003 as shown in FIG. 10A. Then an electroplating operation is used to form a plated metal layer 1005 above the metal layer 1004. The resist 1003 and plating surface 1000 are then stripped, leaving a resilient contact element, and a stop structure 1003A is formed near the resilient contact element. A mask may be used to create a pattern for the stop structures in the resist 1003A, and then the resist 1003A is etched, leaving the stop structure 1003A shown in FIG. 10B. FIG. 10C shows a top view of the resilient contact element and its corresponding stop structure of FIG. 10B.

The resilient contact element of FIG. 10B is typically compressible and resilient at its farthest extent away from its base which is attached to the remnant of the plating surface 1000. Thus, the flexing (to a lower height) of the resilient contact element does not normally occur at the portion of the element which rises vertically from its base. Consequently, a stop structure for such a resilient contact element should have a height which is higher than all possible resilient contact elements (taking into account the range of heights of such elements due to the tolerance of forming such elements). Various methods for forming lithographically resilient contact elements are described in several applications of the present assignee including co-pending U.S. patent application Ser. No. 09/032,473, filed Feb. 26, 1998 and PCT Patent Publication No. WO 97/43654, published Nov. 20, 1997. These various methods may be used with the present invention to create lithographically formed resilient contact elements with stop structures.

Figure 10D:
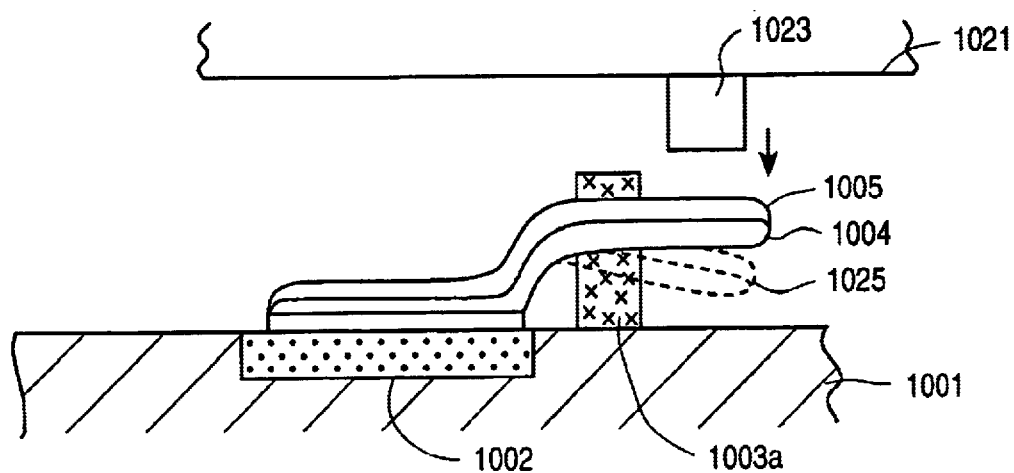
FIG. 10D illustrates in cross-sectional view the interaction between a lithographically formed contact element, another contact element and a stop structure according to one example of the present invention.

FIG. 10D shows an example of an interconnection between a lithographically formed resilient contact element and a contact element 1023 on another substrate 1021. The stop structure 1003A is sized (in height above the resilient contact element) to define the separation between the substrate 1001 and the substrate 1021 when the two structures are pressed together, and this separation determines the amount of flexing of the resilient contact element, shown by dashed representation 1025 of the farthest extent of the resilient contact element. The resilient contact element is caused to flex to this point by the contact element 1023 which is brought into mechanical and electrical contact with the resilient contact element when the substrates 1001 and 1021 are pressed together to the point defined by the height of the stop structure 1003A.

Figure 10E:
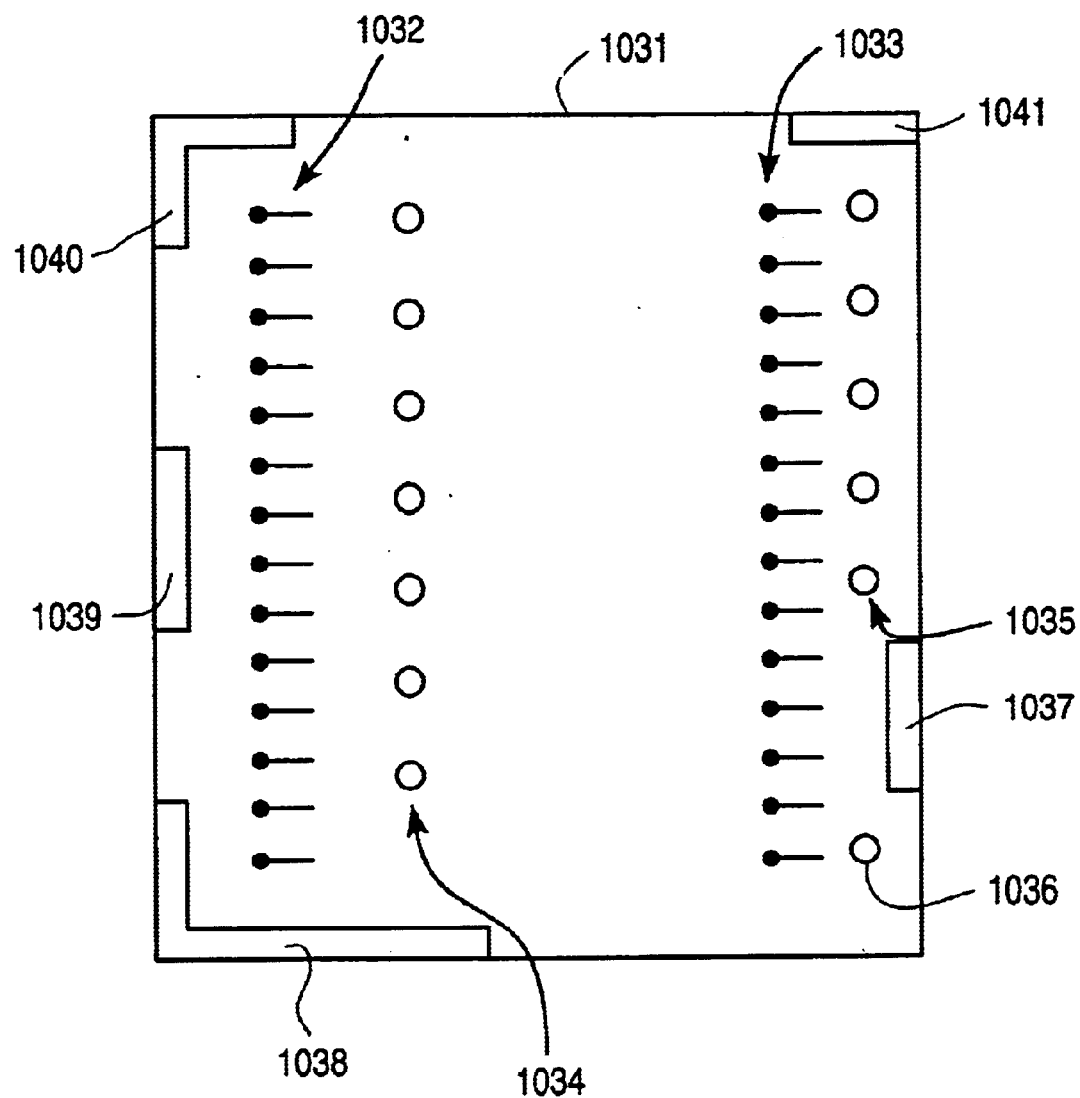
FIG. 10E is a top plan view of a die having a variety of stop structures and two rows of resilient contact elements.
Figure 10F:
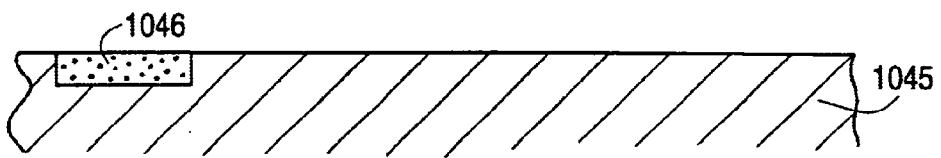
FIGS. 10F through 10M show, through cross-sectional views, a method for lithographically forming a resilient contact element and a stop structure on a substrate such as an integrated circuit.

FIG. 10E shows an example of the invention in which two types of stop structures are used on a substrate 1031. A row of post-like stop structures 1034 and a row of post-like stop structures 1035 and a post-like stop structure are formed on or attached to the substrate 1031. Several perimeter-like stop structures 1037, 1038, 1039, 1040 and 1041 are formed on or attached to the substrate 1031. Typically all these stop structures have the same height above the top surface of substrate 1031. Two rows of resilient contact elements 1032 and 1033 are disposed on the substrate 1031.

Figure 10G:
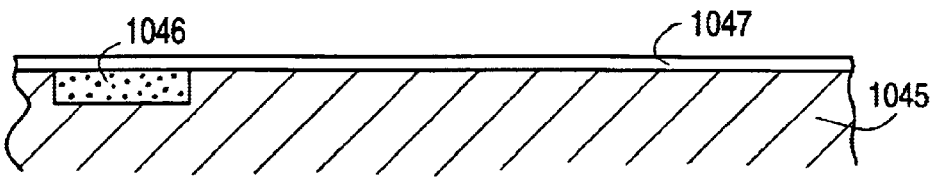
Figure 10H:
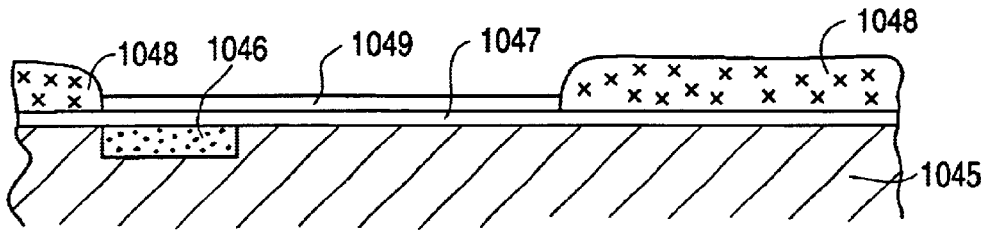
Figure 10I:
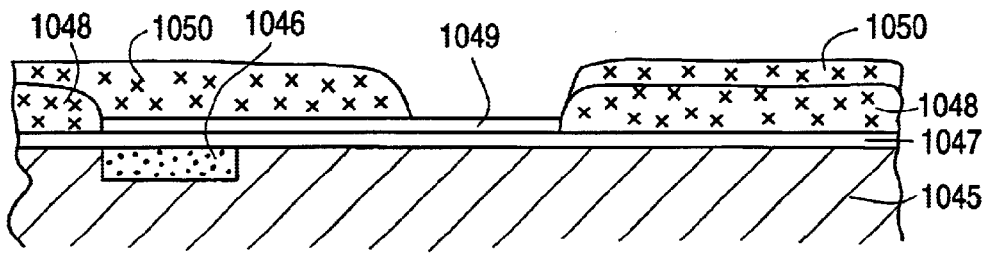
Figure 10J:
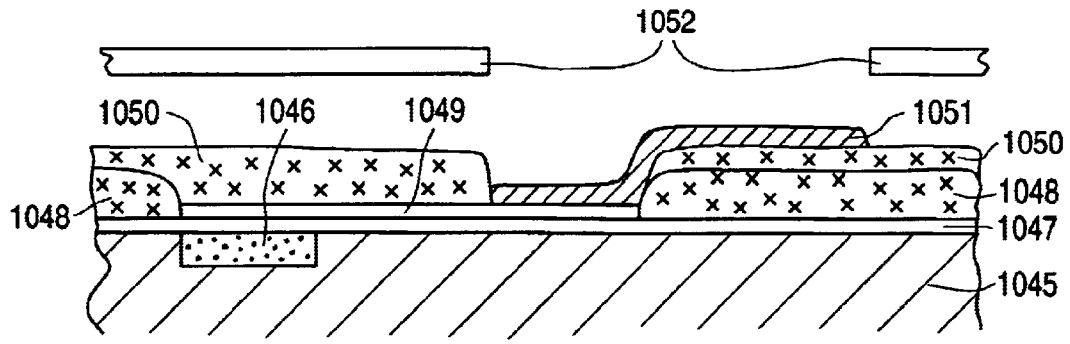
Figure 10K:
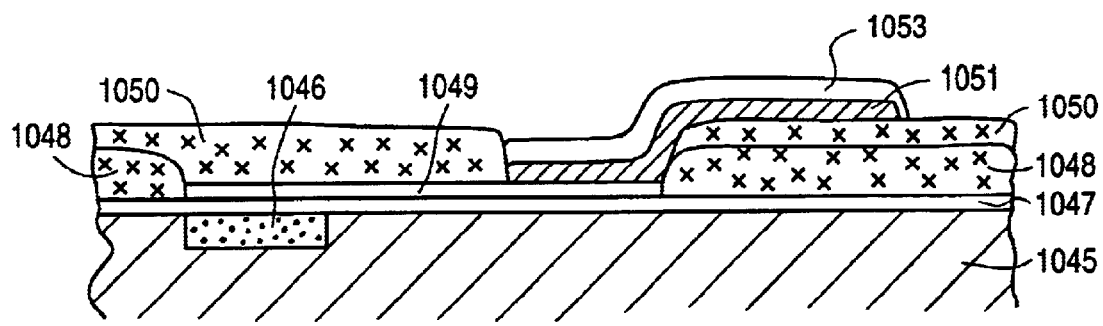
Figure 10L:
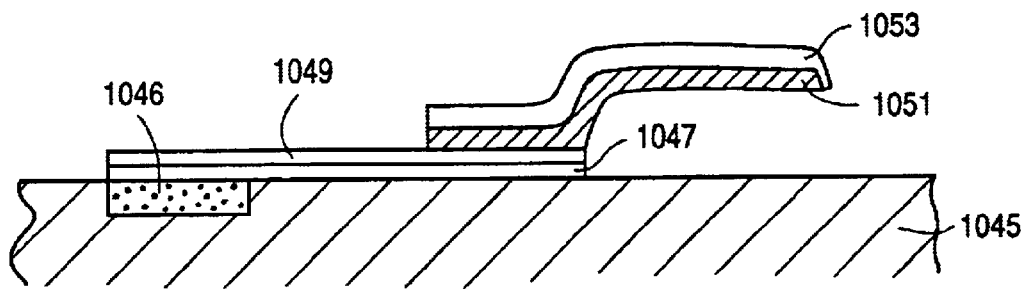
Figure 10M:
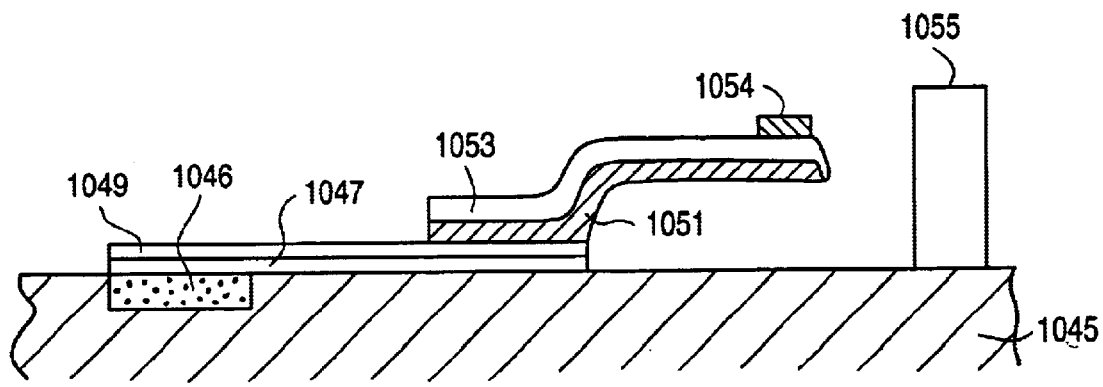

Another method for lithographically forming resilient contact elements is shown in FIG. 10F through FIG. 10M. According to this method, the resilient contact elements are formed on a fan-out pad or a fan-out trace, and thus can produce an assembly which is similar to the assembly shown in FIG. 5B. This method will make an electrical connection between a contact element 1046 and a resilient contact element which can contact electrically another contact element on another substrate. It will be appreciated that contact element 1046 makes electrical contact with other circuit elements not shown and that substrate 1045 may be part of an IC or part of a test or interconnect assembly (e.g. an interposer, space transformer or probe card). As shown in FIG. 10G, a plating layer 1047 (e.g. a blanket metal) is formed (for example by sputtering the blanket metal) on the top surface of the substrate 1045, thereby covering this top surface and making electrical contact with contact element 1046. A photoresist layer is deposited and patterned to leave openings in the photoresist layer 1048 over a portion of the plating layer 1047 and another metal layer 1049 is formed by plating the metal onto the plating layer 1047. FIG. 10H shows the resulting structure. Another photoresist layer is deposited and patterned to create developed photoresist layer 1050 which has an opening over the metal layer 1049 as shown in FIG. 10I. Then a sputtering mask 1052 is used to selectively sputter metal layer 1051 onto a portion of developed photoresist layer 1050 and onto an exposed portion of metal layer 1049. The resulting structure (and the corresponding sputtering mask) are shown in FIG. 10J. Another metal layer 1053 is plated onto the metal layer 1051 resulting in the structure shown in FIG. 10K. Then, the photoresist layers are stripped and portions of the plating layer 1047 not protected by layer 1049 are selectively etched to remove all such portions of plating layer 1047, resulting in the structure shown in FIG. 10L. A stop structure 1055 and a tip 1054 may then be applied respectively to the substrate 1045 and the resilient contact element as shown in FIG. 10M.

Figure 11:
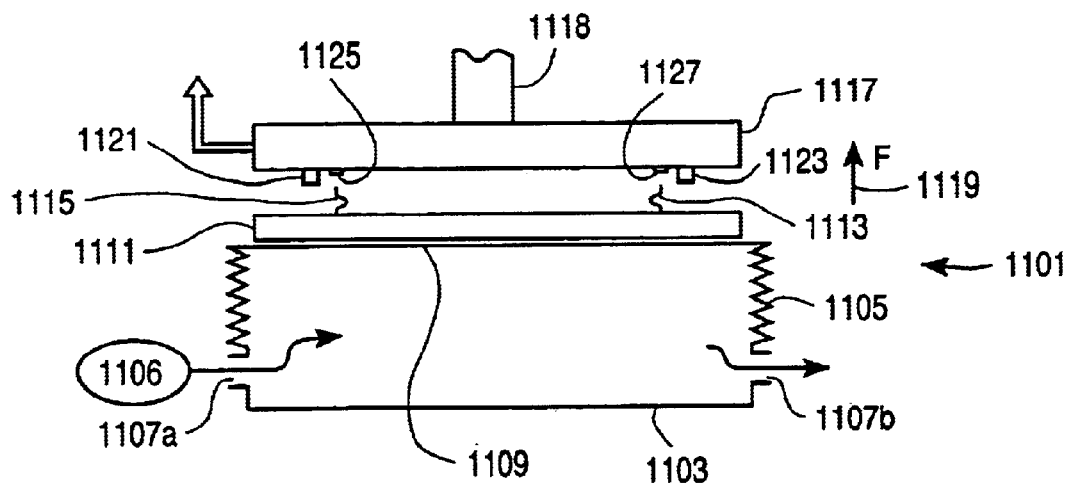
FIG. 11 shows a method of using the interconnect assemblies of the present invention in conjunction with a bellows chuck.

FIG. 11 shows one technique for the use of an interconnect assembly of the present invention. This interconnect 1101 includes a chuck structure or substrate 1117 disposed above a semiconductor wafer 1111, which wafer is supported by a bellows structure 1103. The bellows structure 1103 includes an expandable bellows 1105 and intake and outtake ports 1107A and 1107B. In one use of this bellows structure, a fluid, such as water 1106 is passed into and out of the bellows structure 1103. A thin steel membrane 1109 is welded or otherwise attached to the bellows 1105. The thin membrane may be used to exert uniform pressure against the back of wafer 1111 to press the top surface of the wafer against the stop structures 1121 and 1123, thereby improving the electrical connections between the springs (or other resilient contact elements) on the wafer and the contact elements on substrate 1117. This uniform pressure will typically overcome variations in flatness between the meeting surfaces, such as the top surface of the wafer 1111 and the surface supporting the stop structures 1121 and contact elements 1125 and 1127. This thin steel membrane 1109 also allows for the transfer of heat to or from the semiconductor wafer 1111 which is disposed on top of the membrane 1109. The fluid, such as water 1106, may be introduced into the bellows structure under pressure to force the membrane 1109 into direct contact with the backside of the wafer 1111.

This fluid may be heated or cooled in order to control or effect the temperature of the wafer. For example, in a burn-in test, the fluid may be heated to raise the temperature of the wafer and then cooled over several cycles. The chuck 1117 includes stop structures 1121 and 1123 which are proximally adjacent to contact elements 1125 and 1127 respectively. It may be desirable to place a thermal transfer layer between the membrane 1109 and the back of the wafer 1111 to improve the heat transfer efficiency between the fluid and the wafer 1111. The contact elements 1125 and 1127 are designed to make contact with the resilient contact elements 1115 and 1113 on the wafer 1111. It will be appreciated that there will typically be many more resilient contact elements and many more contact elements than those shown in FIG. 11. The chuck 1117 includes wiring or other interconnection in order to connect resilient contact elements 1115 and 1113, through contact elements 1125 and 1127, to a tester allowing communication of power, signals, and the like between the tester and the semiconductor wafer. The chuck 1117 may be held in place by a post 1118 in order to allow the wafer 1111 to be pressed against the chuck 1117 by the expanding of the bellows 1105; alternatively, the chuck 1117 may be pressed and held by a clamshell support which contacts and covers the top of the chuck 1117 with a backing plate and may also surround the sides and bottom of the bellows 1105.

Figure 12A:
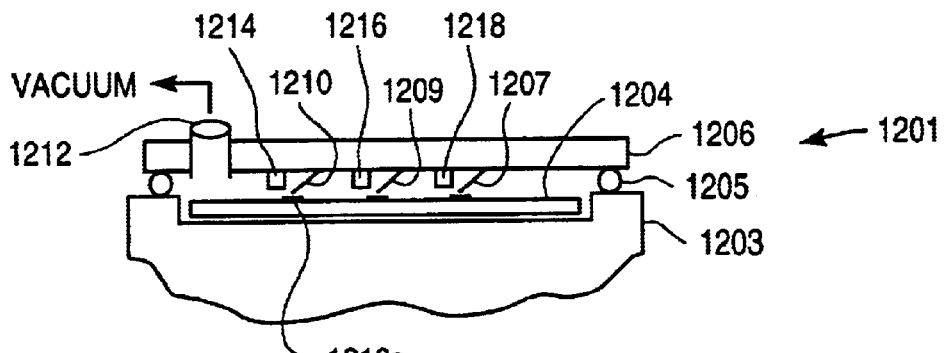
FIG. 12A shows an example of the use of an interconnect assembly of the present invention in conjunction with a vacuum chuck.

FIG. 12A shows another example of an interconnect assembly 1201 according to the present invention. In this case, a chuck 1203 supports a wafer of semiconductor devices 1204. The wafer includes a plurality of contact elements, such as the contact element 1210A which are designed and disposed to make contact relative to resilient contact elements on the wiring substrate 1206. The resilient contact elements 1207, 1209, and 1210 are another example of a resilient element; in this case, they have a generally straight cantilever structure. The stop structures 1214, 1216, and 1218 are attached to the wiring substrate 1206 and are designed to define the z separation between the wiring substrate 1206 and the wafer 1204. A vacuum port 1212 in the wiring substrate 1206 allows a vacuum to be formed between the space between the wiring substrate 1206 and the chuck 1203. The o-ring seal 1205 ensures that a vacuum is formed between the wiring substrate 1206 and the chuck 1203. When the vacuum is formed, the wiring substrate 1206 is pressed down towards the wafer 1204 in order to cause contact to be made between the various resilient contact elements and their corresponding contact elements on the wafer 1204.

Figure 12B:
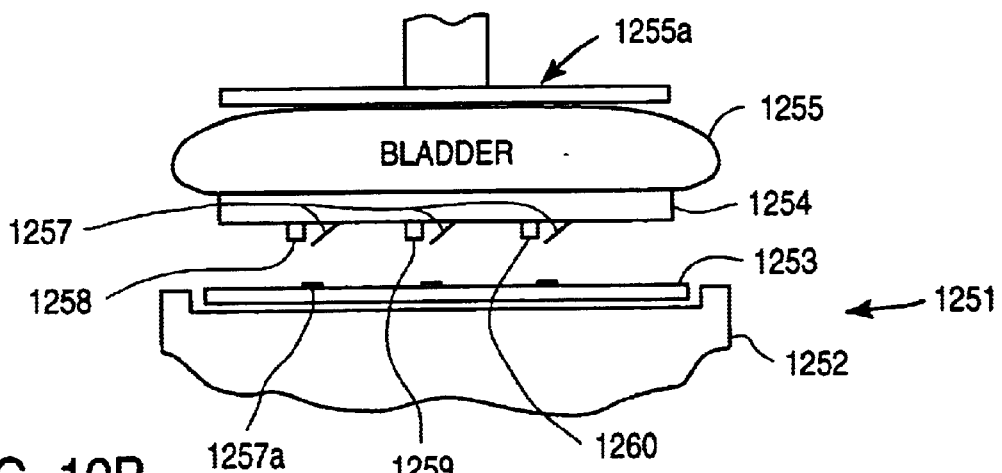
FIG. 12B shows an example of the use of an interconnect assembly according to the present invention in conjunction with a bladder chuck system.

FIG. 12B shows another example of an interconnect assembly 1251 according to the present invention. In this case, a pressure bladder 1255 forces the wiring substrate 1254 in contact with the wafer 1253. A clamp 1255A is used to press the bladder in substrate 1254. The wafer 1253 sits on top of a chuck 1252 and includes a plurality of contact elements, such as the contact element 1257A shown in FIG. 12B. As the bladder 1255 forces the wiring substrate 1254 into contact with the wafer 1253, the stop structures 1258, 1259, and 1260 are brought into contact with the top surface of the wafer 1253. This contact defines a separation between the wiring substrate 1254 and the semiconductor wafer 1253. When this contact occurs, the resilient contact elements 1257 are brought into mechanical and electrical contact with their corresponding contact elements on the wafer 1253.

Figure 13:
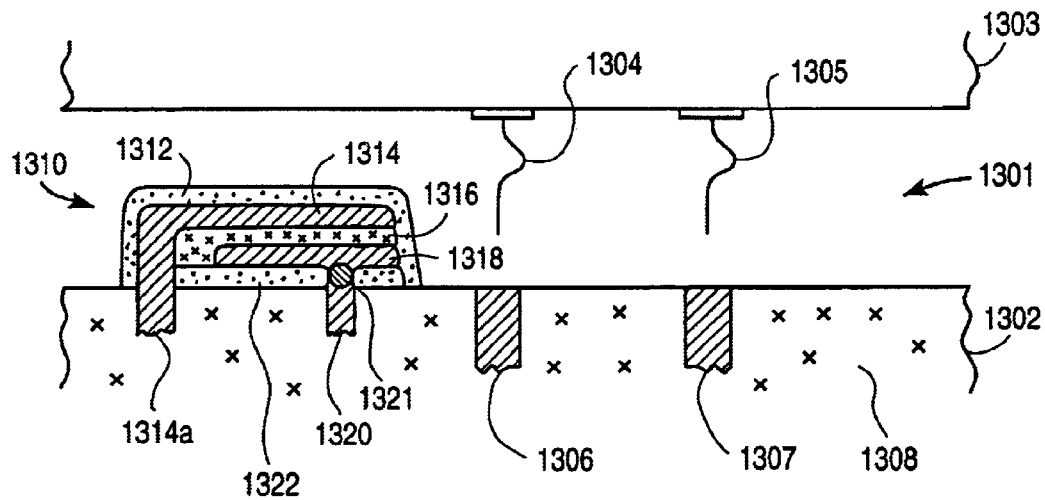
FIG. 13 shows an example of a stop structure having a circuit element according to one embodiment of the present invention.

FIG. 13 shows an example of an interconnect assembly 1301 which includes a stop structure 1310 that houses a circuit element, in this case a capacitor, which is coupled to circuitry in the integrated circuit of the substrate 1302. The stop structure 1310 is designed to define the minimum vertical separation between the substrate 1302 and the substrate 1303 when the resilient contact elements 1304 and 1305 are brought into mechanical and electrical contact with their corresponding contact elements 1306 and 1307 in the substrate 1302. The contact elements 1307 and 1306 are contained within an insulating material 1308 which may be a conventional dielectric material used in fabricating integrated circuits. It will be appreciated that the interconnection to an exemplary circuit element 1330 within the integrated circuit in the substrate 1302 is shown in FIG. 13, which is a cross-sectional view through the stop structure 1310 and the substrate 1302. The stop structure 1310 is a multilayer structure including several dielectric layers and several conductive layers which may be metal layers. In the example shown in FIG. 13, metal (or other conductive) layers 1314 and 1318 are separated by an insulating layer 1316 to form a capacitor. The metal layers 1314 and 1318 as well as the insulating layers 1316 and 1322 are encapsulated within an insulating layer 1312. The stop structure 1310 itself may resemble a post or cylinder or other shapes (e.g. rectangular, arbitrary pattern, zig-zag of connected rectangle, etc.) which is completely covered by the encapsulating insulating layer 1312. This insulating layer may be a polyimide material or silicon dioxide or other insulator. The metal layer 1318 is coupled electrically in one embodiment by a solder ball 1321 to a post or other contact element 1320 in the substrate 302. The metal layer 1314 is coupled by a post structure 1314A which extends into the substrate 1302. In this manner, the capacitor in the stop structure 1310 is coupled electrically to a circuit element 1330 in the substrate 1302. It will be appreciated that there will be a number of well known techniques which may be employed in fabricating the stop structure 1310 to include an electrical element, such as the capacitor. In one example, the post structures 1314A and 1320 may be formed in the substrate 1302. Then a dielectric layer 1322 may be formed and patterned to allow an opening for the solder balls, such as the solder ball 1321. Alternatively, a metal layer 1318 may be sputtered upon the entire surface, filling the opening in the insulating layer 1322. Then the metal layer 1318 is patterned in the form shown in FIG. 13, and another insulating layer is deposited over the metal layer 1318. This insulating layer is then patterned to create an insulating layer 1316 and then another metal layer is deposited upon the surface and patterned to create the metal layer 1314. Finally, an insulating layer or other passivating layer is applied and patterned to create the insulating layer 1312 in order to complete the formation of the stop structure 1310.

Figure 14:
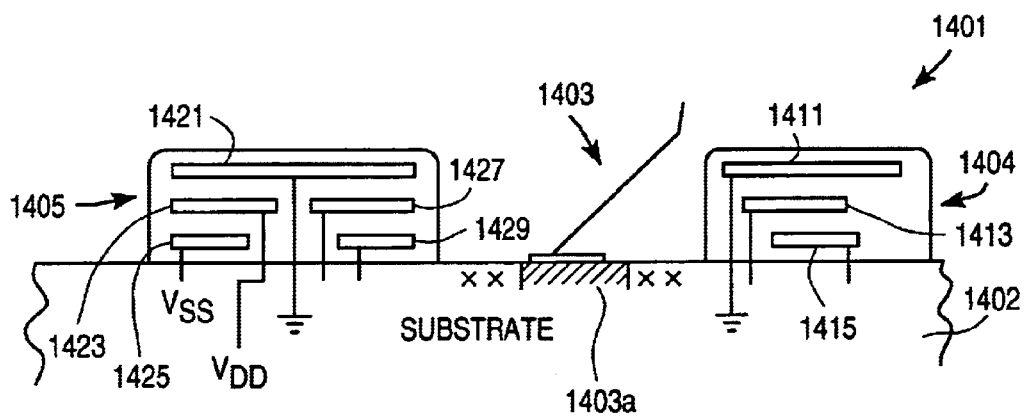
FIG. 14 illustrates two stop structures, each of which includes at least one circuit element according to one example of the present invention.

FIG. 14 shows another example of an interconnect assembly. This interconnect assembly 1401 includes two stop structures 1404 and 1405, each of which contain circuit elements which are coupled to electrical circuit elements in the substrate 1402. The substrate 1402 also includes a post or other contact element 1403A which is coupled mechanically and electrically to a resilient contact element 1403.

The stop structure 1404 includes a ground shield 1411 which is coupled to a ground bus or other circuit in the substrate 1402. As used herein, the term circuit element includes a ground shield or plane. Thus, a stop structure may include a ground shield in accordance with the present invention as shown in FIG. 14. The stop structure 1414 also includes a capacitor having conductive plates 1413 and 1415 which are coupled electrically to at least one circuit element in the substrate 1402.

The stop structure 1405 also includes a ground shield 1421 coupled electrically to a ground circuit in the substrate 1402. The stop structure 1405 also includes a capacitor formed by the conducting plates 1427 and 1429 which are electrically coupled to at least one circuit element in the substrate 1402. In addition, the stop structure 1405 includes conductive elements 1423 and 1425 which provide reference voltages, such as $V_{ss}$ and $V_{dd}$ which may be bussed through the stop structure to electrical components in the stop structure or to electrical components outside of the stop structure.

Further aspects concerning the assemblies of FIGS. 13 and 14 may be found in co-pending U.S. patent application Ser. No. 09/114,589, filed on the same date as this application by Igor Y. Khandros, David V. Pedersen, Benjamin N. Eldridge, Richard S. Roy and Gaetan Mathieu.

It will be appreciated that the foregoing description provides illustrative examples of the present invention and is not intended to provide an exhaustive list of the various materials or methods which may be used in creating the interconnect assemblies of the present invention. For example, while polyimide materials may be used to form the stop structures of the present invention, it will be appreciated that other materials may be used, including photoresist which are capable of producing high aspect ratios and which may be cured and left in place as a mechanical element, such as the photoresist SU8. Alternatively, a fill-cured epoxy sheet or polymeric materials or certain metals may also be used as the materials to create the stop structures. Indeed, the stop structure may be formed from any material which is stable at the desired temperatures to which the structure will be exposed, including testing and/or burn-in environments and the expected use environment. It is anticipated that the stop structures according to the present invention will have a minimum height of about 80 microns, although smaller height stop structures are within the scope of the present invention.

In the foregoing specification, the present invention has been described with reference to specific exemplary embodiments thereof. It will, however, be evident that various modifications and changes may be made thereto without departing from the broader scope and spirit of the invention as set forth in the appended claims. The specification and drawings are, accordingly, to be regarded in an illustrative rather than in a restrictive sense.

What is claimed is:

1. An interconnect assembly comprising:
    a first substrate having a first plurality of contact elements disposed on a surface thereof;
    a second substrate having a second plurality of contact elements disposed on a surface thereof;
    a plurality of elongate resilient contact structures electrically interconnecting said first plurality of contact elements and said second plurality of contact elements;
    a stop structure disposed on said first substrate and extending away from said surface of said first substrate to define a minimum separation between said first substrate and said second substrate, wherein said stop structure does not enclose said elongate resilient contact structures; and
    a first circuit element embedded within said stop structure and electrically connected to a second circuit element associated with said first substrate.

2. An interconnect assembly as in claim 1 wherein said plurality of elongate resilient contact elements are attached to said first plurality of contact elements on said first substrate.

3. An interconnect assembly as in claim 1 wherein said resilient contact elements comprise spring structures.

4. An interconnect assembly as in claim 1 wherein said stop structure comprises an adhesive layer.

5. An interconnect assembly as in claim 4 wherein said adhesive layer bonds said stop structure to said first substrate.

6. An interconnect assembly as in claim 1 wherein said first substrate and said second substrate are formed toward each other by a vacuum generated between said first substrate and said second substrate.

7. An interconnect assembly as in claim 1 wherein said first substrate and said second substrate are formed toward each other by one of a pressurized bladder or a bellows and wherein a fluid in said bladder or said bellows is capable of controlling a temperature of at least one of said first substrate and said second substrate.

8. An interconnect assembly as in claim 1 wherein said first substrate is part of a probe card assembly, and said second substrate is a semiconductor wafer.

9. An interconnect assembly as in claim 1 wherein said first substrate is part of a wafer-level test assembly, and said second substrate is a semiconductor wafer.

10. An interconnect assembly as in claim 1 wherein said stop structure is formed lithographically.

11. An interconnect assembly as in claim 1 wherein said stop structure is formed from one of (a) a photoresist material; (b) an epoxy material; (c) a metal coated with an electrophoretic epoxy or (d) a polymeric material.

12. An interconnect assembly as in claim 1 wherein said plurality of elongate resilient contact structures are attached to said second contact elements on said second substrate.

13. An interconnect assembly as in claim 1 wherein said second substrate is part of a probe card assembly, and said first substrate is a semiconductor wafer.

14. An interconnect assembly as in claim 1 wherein said second substrate is part of a wafer-level test assembly, and said first substrate is a semiconductor wafer.

15. An interconnect assembly as in claim 1, wherein said first circuit element comprises a capacitor.

16. An interconnect assembly as in claim 15, wherein said capacitor comprises a plurality of layers of material including metal layers and at least one dielectric layer, said layers of material composing said stop structure.

17. An interconnect assembly as in claim 1 wherein said stop structure further comprises a shield plane.

18. An interconnect assembly as in claim 17, wherein said shield plane is grounded.

19. An interconnect assembly as in claim 1 further comprising a plurality of circuit elements embedded within said stop structure.

20. An interconnect assembly as in claim 1, wherein said first circuit element embedded within said stop structure is electrically connected to said second circuit element through traces embedded within said first substrate.

* * * * *